(12) United States Patent
Lee et al.

(10) Patent No.: US 11,844,256 B2
(45) Date of Patent: Dec. 12, 2023

(54) DISPLAY DEVICE INCLUDING THIRD CONDUCTIVE LAYER DIRECTLY CONTACTING FIRST CONDUCTIVE LAYER AND SECOND CONDUCTIVE LAYER

(71) Applicant: Samsung Display Co., Ltd., Yongin-Si (KR)

(72) Inventors: Dongmin Lee, Anyang-si (KR); Taewook Kang, Seongnam-si (KR); Hyunah Sung, Suwon-si (KR); Sukyoung Yang, Hwaseong-si (KR); Dokeun Song, Yongin-si (KR); Hyuneok Shin, Gwacheon-si (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 78 days.

(21) Appl. No.: 17/363,496

(22) Filed: Jun. 30, 2021

(65) Prior Publication Data
US 2022/0149143 A1 May 12, 2022

(30) Foreign Application Priority Data
Nov. 12, 2020 (KR) .......................... 10-2020-0151387

(51) Int. Cl.
*H01L 29/08* (2006.01)
*H10K 59/131* (2023.01)
(Continued)

(52) U.S. Cl.
CPC ......... *H10K 59/1315* (2023.02); *C22C 21/00* (2013.01); *H10K 59/126* (2023.02);
(Continued)

(58) Field of Classification Search
CPC ............. H01L 27/3279; H01L 27/3262; H01L 27/3265; H01L 27/3272; H01L 27/1255; H01L 27/1222; H01L 51/0097
(Continued)

(56) References Cited

U.S. PATENT DOCUMENTS

2014/0034950 A1* 2/2014 Li ........................... H01L 31/02
257/53
2019/0181360 A1* 6/2019 Cha ......................... H10K 71/00
(Continued)

FOREIGN PATENT DOCUMENTS

CN 109671717 A * 4/2019 ......... H01L 21/2855
CN 111916025 A * 11/2020 ............. G09F 9/301
(Continued)

*Primary Examiner* — Phuc T Dang
(74) *Attorney, Agent, or Firm* — CANTOR COLBURN LLP

(57) ABSTRACT

A display device includes a base substrate, a buffer layer disposed on the base substrate, an active layer disposed on the buffer layer, a first gate insulation layer disposed on the active layer, a first conductive layer disposed on the first gate insulation layer and which is a single-layer including an aluminum alloy, a second gate insulation layer disposed on the first conductive layer, a second conductive layer disposed on the second gate insulation layer and which is a single-layer including an aluminum alloy, an insulation interlayer disposed on the second conductive layer, and a third conductive layer disposed on the insulation interlayer, directly contacting the first conductive layer through a first gate contact hole defined in the insulation interlayer and the second gate insulation layer, and directly contacting the second conductive layer through a second gate contact hole defined in the insulation interlayer.

17 Claims, 13 Drawing Sheets

(51) Int. Cl.
  *C22C 21/00* (2006.01)
  *H10K 59/126* (2023.01)
  *H10K 59/121* (2023.01)
  *H10K 77/10* (2023.01)
  *H01L 29/66* (2006.01)
  *H01L 27/12* (2006.01)
  *H01L 29/786* (2006.01)
  *H10K 59/12* (2023.01)
  *H10K 102/00* (2023.01)

(52) U.S. Cl.
  CPC ..... H10K 59/1213 (2023.02); H10K 59/1216 (2023.02); H10K 77/111 (2023.02); *H01L 27/124* (2013.01); *H01L 27/127* (2013.01); *H01L 27/1222* (2013.01); *H01L 27/1255* (2013.01); *H01L 29/66757* (2013.01); *H01L 29/78675* (2013.01); *H10K 59/1201* (2023.02); *H10K 2102/311* (2023.02)

(58) Field of Classification Search
  USPC .......................................................... 257/40
  See application file for complete search history.

(56) References Cited

U.S. PATENT DOCUMENTS

2020/0193917 A1* 6/2020 Park ..................... G09G 3/3258
2020/0266259 A1* 8/2020 Lee ..................... H10K 59/1216

FOREIGN PATENT DOCUMENTS

| KR | 1020090095300 A | | 9/2009 | |
| KR | 101084277 B1 | | 11/2011 | |
| KR | 1020200000856 A | | 1/2020 | |
| KR | 102077723 B1 | | 4/2020 | |
| KR | 20200047898 A | * | 5/2020 | ......... A61K 31/4725 |
| KR | 102126535 B1 | | 6/2020 | |
| KR | 1020210054113 A | | 5/2021 | |

* cited by examiner

DISPLAY DEVICE INCLUDING THIRD CONDUCTIVE LAYER DIRECTLY CONTACTING FIRST CONDUCTIVE LAYER AND SECOND CONDUCTIVE LAYER

This application claims priority to Korean Patent Application No. 10-2020-0151387 filed on Nov. 12, 2020, and all the benefits accruing therefrom under 35 U.S.C. § 119, the content of which in its entirety is herein incorporated by reference.

BACKGROUND

1. Field

Embodiments relate to a display device. More particularly, embodiments relate to a display device including conductive layers and a method of manufacturing the display device.

2. Description of the Related Art

As a display field for visually expressing various electrical signals develops rapidly, various flat panel display devices having excellent characteristics such as reduction in thickness, light weight, low power consumption, etc. have been used. Among the flat panel display devices, a liquid crystal display device and an organic light emitting display device are widely commercialized because of their excellent resolution and image quality. Specifically, the organic light emitting display device is drawing attention as a next-generation flat panel display device because of fast response speed, low power consumption, and excellent viewing angle.

Demand for a display device having a high resolution is increasing, and accordingly, research is being conducted in a direction in which the number of pixels per unit area increases. In order to rapidly process an image signal applied to a high-resolution display device, the need for a wiring with low electrical resistance is increasing, and for this purpose, research is being conducted on a method of using aluminum (Al) or the like, which replaces the existing molybdenum (Mo) or the like, as a material for the wiring.

SUMMARY

In a high-temperature process, a hillock of aluminum (Al) may occur on a surface of a wiring including aluminum (Al). A capping layer including titanium (Ti), etc. may be further formed on a wiring layer including aluminum (Al) to prevent the occurrence of the hillock. However, when the thickness of the capping layer increases, a side roughness of the wiring may excessively increase.

Embodiments provide a display device including a conductive layer having low electrical resistance and high heat resistance.

Embodiments provide a method of manufacturing a display device for preventing a conductive layer from being damaged.

A display device according to an embodiment includes a base substrate, a buffer layer disposed on the base substrate, an active layer disposed on the buffer layer, a first gate insulation layer disposed on the active layer, a first conductive layer disposed on the first gate insulation layer and which is a single-layer including an aluminum alloy, a second gate insulation layer disposed on the first conductive layer, a second conductive layer disposed on the second gate insulation layer and which is a single-layer including an aluminum alloy, an insulation interlayer disposed on the second conductive layer, and a third conductive layer disposed on the insulation interlayer, directly contacting the first conductive layer through a first gate contact hole defined in the insulation interlayer and the second gate insulation layer, and directly contacting the second conductive layer through a second gate contact hole defined in the insulation interlayer.

In an embodiment, the aluminum alloy of the first conductive layer may include at least one of nickel (Ni), lanthanum (La), neodymium (Nd), and germanium (Ge).

In an embodiment, a content of materials other than aluminum in the aluminum alloy of the first conductive layer may be less than or equal to about 2 atomic percentages (at %).

In an embodiment, the aluminum alloy of the first conductive layer may include nickel (Ni) and lanthanum (La).

In an embodiment, a sum of a content of nickel and a content of lanthanum in the aluminum alloy of the first conductive layer may be about 0.02 at % to about 0.15 at %.

In an embodiment, in the aluminum alloy of the first conductive layer, a content of nickel may be about 0.01 at % to about 0.05 at %, and a content of lanthanum may be about 0.01 at % to about 0.1 at %.

In an embodiment, a thickness of a first portion of the first conductive layer which directly contacts the third conductive layer may be less than a thickness of a second portion of the first conductive layer which does not directly contact the third conductive layer, and a thickness of a first portion of the second conductive layer which directly contacts the third conductive layer may be less than a thickness of a second portion of the second conductive layer which does not directly contact the third conductive layer.

In an embodiment, the active layer may include polycrystalline silicon.

In an embodiment, the first conductive layer and the second conductive layer may form a storage capacitor.

In an embodiment, the second conductive layer may include a shielding electrode.

In an embodiment, the second conductive layer may include an initialization voltage line.

In an embodiment, the third conductive layer may include a power voltage line.

In an embodiment, the display device may further include a bendable area. A first opening overlapping the bendable area in a plan view may be defined in the insulation interlayer, the second gate insulation layer, the first gate insulation layer, and a first portion of the buffer layer. A second opening overlapping the bendable area in the plan view may be defined in a second portion of the buffer layer and a portion of the base substrate.

In an embodiment, the base substrate may include a first organic layer, a first barrier layer disposed on the first organic layer, a second organic layer disposed on the first barrier layer, and a second barrier layer disposed on the second organic layer. The buffer layer may include a first buffer layer disposed on the base substrate and including silicon oxide and a second buffer layer disposed on the first buffer layer and including silicon nitride.

In an embodiment, the first portion of the buffer layer may be the second buffer layer, the second portion of the buffer layer may be the first buffer layer, and the portion of the base substrate may be the second barrier layer.

In an embodiment, a width of the first opening may be greater than a width of the second opening.

In an embodiment, the display device may further include a planarization layer disposed on the third conductive layer, a first electrode disposed on the planarization layer, an emission layer disposed on the first electrode, and a second electrode disposed on the emission layer.

A method of manufacturing a display device according to an embodiment includes: forming a buffer layer on a base substrate; forming an active layer on the buffer layer; forming a first gate insulation layer on the active layer; forming a first conductive layer on the first gate insulation layer, where the first conductive layer is formed as a single-layer including an aluminum alloy; forming a second gate insulation layer on the first conductive layer; forming a second conductive layer on the second gate insulation layer, where the second conductive layer is formed as a single-layer including an aluminum alloy; forming an insulation interlayer on the second conductive layer; forming i) an active contact hole which exposes the active layer in the insulation interlayer, the second gate insulation layer, and the first gate insulation layer and ii) a first opening which overlaps a bendable area in the insulation interlayer, the second gate insulation layer, the first gate insulation layer, and a first portion of the buffer layer, together; forming i) a first gate contact hole which exposes the first conductive layer in the insulation interlayer and the second gate insulation layer and ii) a second opening which overlaps the bendable area in a second portion of the buffer layer and a portion of the base substrate, together; and forming a third conductive layer on the insulation interlayer, where the third conductive layer is connected to the active layer through the active contact hole and directly contacts the first conductive layer through the first gate contact hole.

In an embodiment, the method may further include after forming the active contact hole and the first opening together and before forming the first gate contact hole and the second opening together, heat-treating the active layer and removing an oxide layer formed on the active layer by the heat-treatment.

In an embodiment, the oxide layer may be removed by a buffered oxide etchant ("BOE") or hydrogen fluoride ("HF").

In an embodiment, forming the first gate contact hole and the second opening together may include forming a second contact hole which exposes the second conductive layer in the insulation interlayer. The third conductive layer may directly contact the second conductive layer through the second gate contact hole.

In the display device according to the embodiments, each of the first conductive layer and the second conductive layer may be formed as the single-layer including the aluminum alloy, and the third conductive layer may directly contact the first conductive layer and the second conductive layer, so that electrical resistance of each of the first conductive layer and the second conductive layer may decrease, and heat resistance of each of the first conductive layer and the second conductive layer may increase.

In the method of manufacturing the display device according to the embodiments, the first gate contact hole may be formed after forming the active contact hole, so that the first conductive layer may not be damaged in the process of forming the active contact hole and the first gate contact hole.

BRIEF DESCRIPTION OF THE DRAWINGS

Illustrative, non-limiting embodiments will be more clearly understood from the following detailed description taken in conjunction with the accompanying drawings.

DETAILED DESCRIPTION

Figure 1:
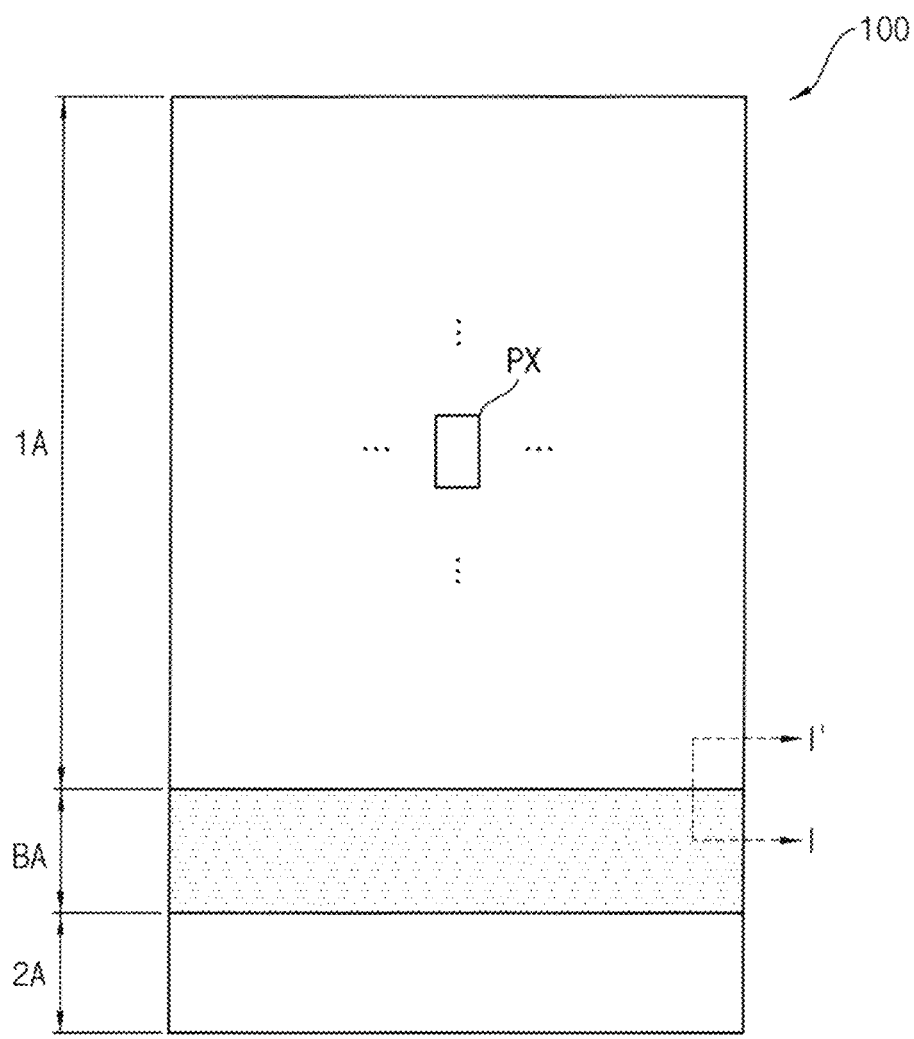
FIG. 1 is a plan view illustrating a display device according to an embodiment.

It will be understood that when an element is referred to as being "on" another element, it can be directly on the other element or intervening elements may be present therebetween. In contrast, when an element is referred to as being "directly on" another element, there are no intervening elements present.

It will be understood that, although the terms "first," "second," "third" etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, "a first element," "component," "region," "layer" or "section" discussed below could be termed a second element, component, region, layer or section without departing from the teachings herein.

The terminology used herein is for the purpose of describing particular embodiments only and is not intended to be limiting. As used herein, the singular forms "a," "an," and "the" are intended to include the plural forms, including "at least one," unless the content clearly indicates otherwise. "At least one" is not to be construed as limiting "a" or "an." "Or" means "and/or." As used herein, the term "and/or" includes any and all combinations of one or more of the associated listed items. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Furthermore, relative terms, such as "lower" or "bottom" and "upper" or "top," may be used herein to describe one element's relationship to another element as illustrated in the Figures. It will be understood that relative terms are intended to encompass different orientations of the device in addition to the orientation depicted in the Figures. For example, if the device in one of the figures is turned over, elements described as being on the "lower" side of other elements would then be oriented on "upper" sides of the other elements. The exemplary term "lower," can therefore, encompasses both an orientation of "lower" and "upper," depending on the particular orientation of the figure. Similarly, if the device in one of the figures is turned over, elements described as "below" or "beneath" other elements would then be oriented "above" the other elements. The exemplary terms "below" or "beneath" can, therefore, encompass both an orientation of above and below.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within ±30%, 20%, 10% or 5% of the stated value. Hereinafter, display devices and methods of manufacturing display devices in accordance with embodiments will be explained in detail with reference to the accompanying drawings.

Hereinafter, a display device according to an embodiment will be described with reference to FIGS. 1 to 7.

FIG. 1 is a plan view illustrating a display device 100 according to an embodiment.

Referring to FIG. 1, the display device 100 may include a first area 1A, a second area 2A, and a bendable area BA. In an embodiment, pixels PX for emitting light may be disposed in the first area 1A. In such an embodiment, the first area 1A may be a display area in which an image is displayed through the pixels PX.

The second area 2A may be spaced apart from the first area 1A. In an embodiment, pads connected to an integrated circuit, a printed circuit board, etc. may be disposed in the second area 2A. In such an embodiment, the second area 2A may be a non-display area in which an image is not displayed.

The bendable area BA may be disposed between the first area 1A and the second area 2A. The bendable area BA may be bendable. In an embodiment, the bendable area BA may be bent such that the first area 1A and the second area 2A face each other.

In an embodiment, wirings connecting the pixels PX and the pads may be disposed in the bendable area BA. In such an embodiment, the bendable area BA may be a non-display area in which an image is not displayed.

Figure 2:
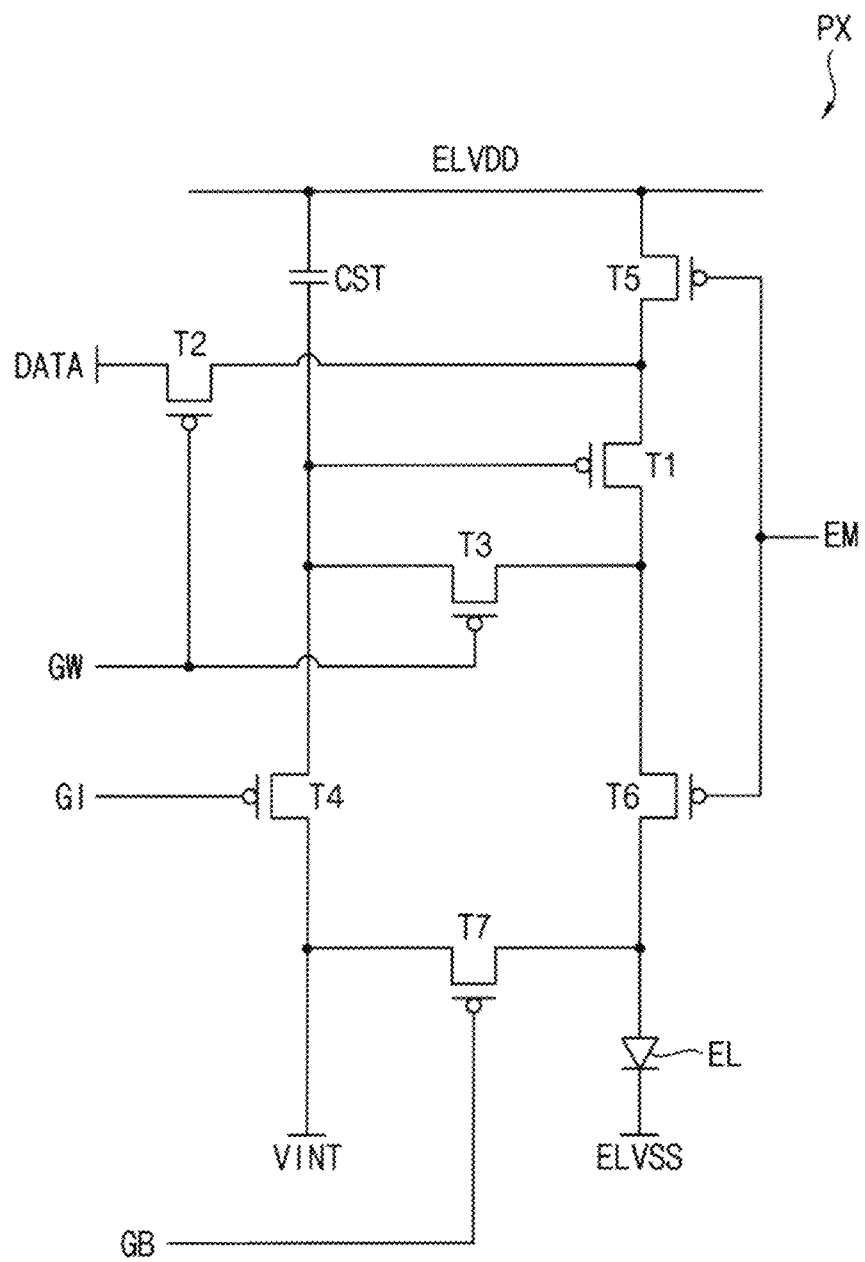
FIG. 2 is a circuit diagram illustrating a pixel of the display device in FIG. 1.

FIG. 2 is a circuit diagram illustrating the pixel PX of the display device 100 in FIG. 1.

Referring to FIG. 2, the pixel PX may include a plurality of transistors T1, T2, T3, T4, T5, T6, and T7, a storage capacitor CST, and a light emitting element EL. The transistors T1, T2, T3, T4, T5, T6, and T7 may include a first transistor T1, a second transistor T2, a third transistor T3, a fourth transistor T4, a fifth transistor. T5, a sixth transistor T6, and a seventh transistor T7.

The first transistor T1 may provide a driving current corresponding to a data voltage DATA to the light emitting element EL. For example, the first transistor T1 may be a driving transistor.

The second transistor T2 may provide the data voltage DATA to the first transistor T1 in response to a first gate signal GW. For example, the second transistor T2 may be a switching transistor.

The third transistor T3 may diode-connect the first transistor T1 in response to the first gate signal GW to compensate a threshold voltage of the first transistor T1. For example, the third transistor T3 may be a compensation transistor.

The fourth transistor T4 may provide an initialization voltage VINT to a gate electrode of the first transistor T1 in response to a second gate signal GI. For example, the fourth transistor T4 may be a driving initialization transistor.

Each of the fifth transistor T5 and the sixth transistor T6 may provide the driving current to the light emitting element EL in response to an emission control signal EM. For example, each of the fifth transistor T5 and the sixth transistor T6 may be an emission control transistor.

The seventh transistor T7 may provide the initialization voltage VINT to the light emitting element EL in response to a third gate signal GB. For example, the seventh transistor T7 may be a diode initialization transistor.

The storage capacitor CST may be connected between a power supply providing a first power voltage ELVDD and the gate electrode of the first transistor T1. The light emitting element EL may be connected between the sixth transistor T6 and a power supply providing a second power voltage ELVSS. The light emitting element EL may emit light based on the driving current.

Figure 3:
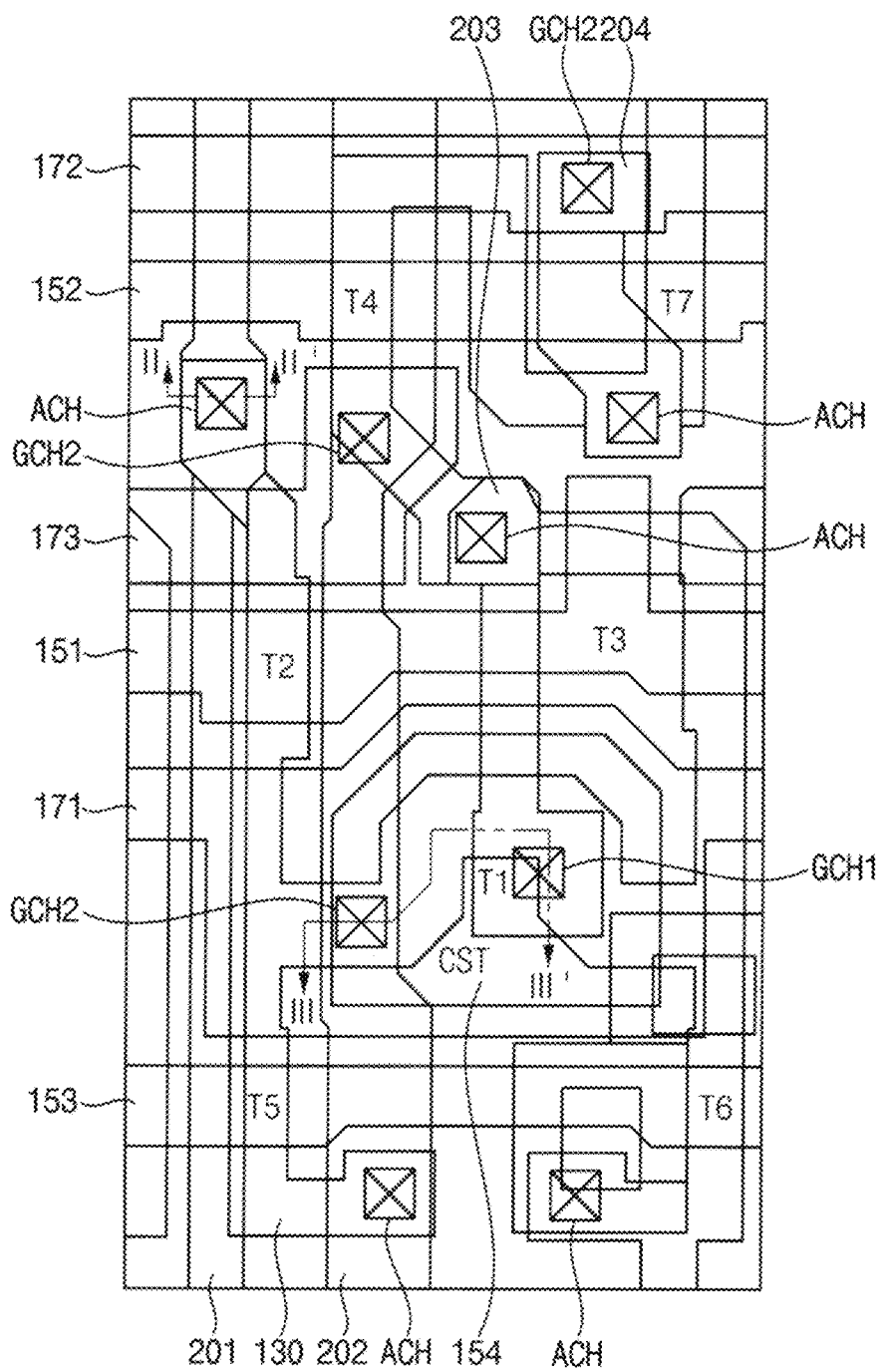
FIG. 3 is a layout diagram illustrating the pixel in FIG. 2.
Figure 4:
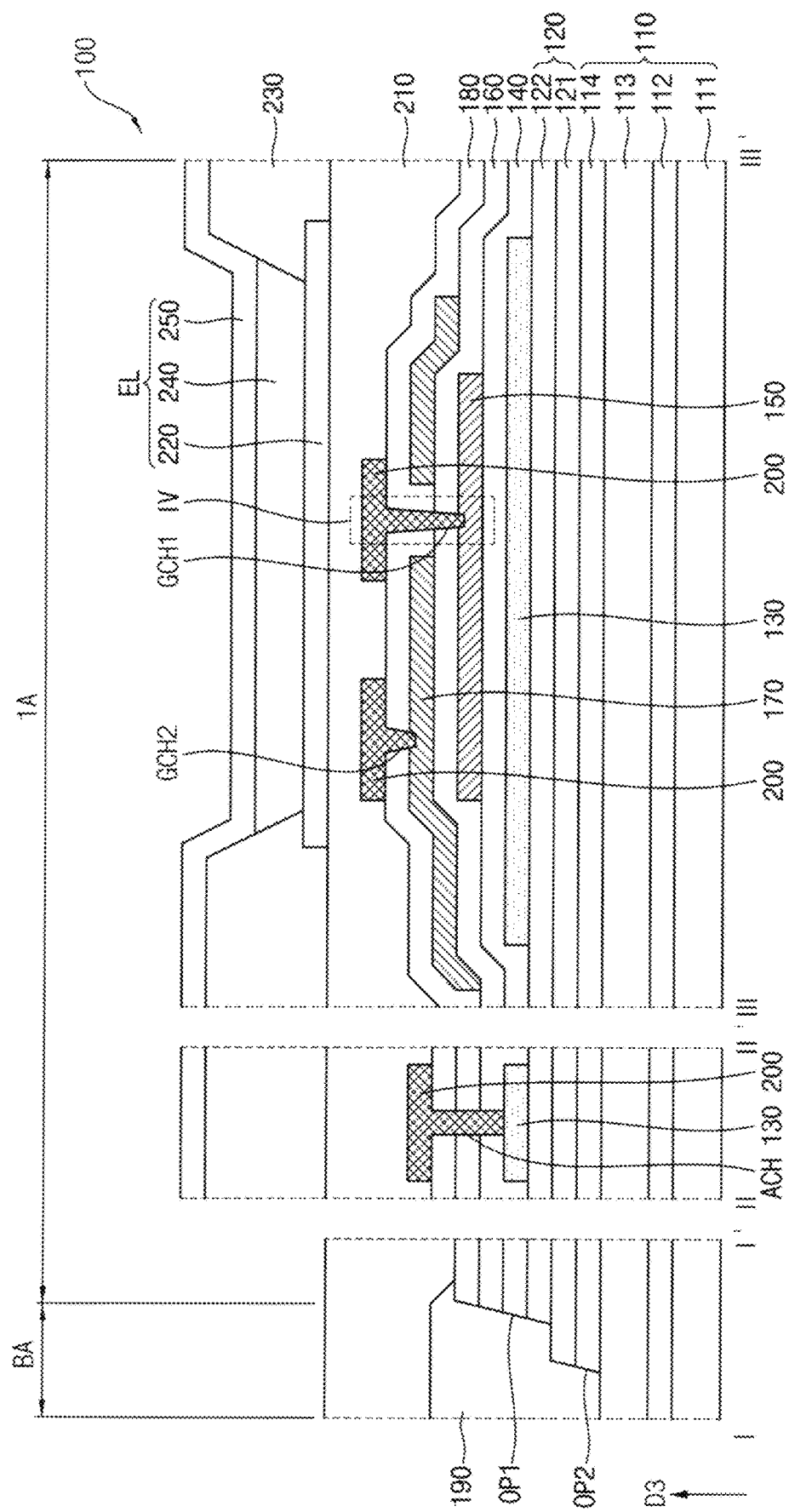
FIG. 4 is a cross-sectional view illustrating a display device according to an embodiment.

FIG. 3 is a layout diagram illustrating the pixel PX in FIG. 2. FIG. 4 is a cross-sectional view illustrating a display device 100 according to an embodiment. For example, FIG. 4 may illustrate the display device 100 taken along line I-I' in FIG. 1, and line II-II' and line III-III' in FIG. 3.

Referring to FIGS. 3 and 4, the display device 100 may include a base substrate 110, a buffer layer 120, an active layer 130, a first gate insulation layer 140, a first conductive layer 150, a second gate insulation layer 160, a second conductive layer 170, an insulation interlayer 180, a stress relaxation layer 190, a third conductive layer 200, a planarization layer 210, a first electrode 220, a pixel defining layer 230, an emission layer 240, and a second electrode 250.

In an embodiment, the base substrate 110 may be a flexible substrate. For example, the base substrate 110 may include an organic material. In such an embodiment, the display device 100 may be a flexible display device.

In an embodiment, the base substrate 110 may include a first organic layer 111, a first barrier layer 112, a second organic layer 113, and a second barrier layer 114. The first barrier layer 112 may be disposed on the first organic layer 111. The second organic layer 113 may be disposed on the first barrier layer 112. The second barrier layer 114 may be disposed on the second organic layer 113.

Each of the first organic layer 111 and the second organic layer 113 may include an organic material such as a photoresist, polyacrylic resin, polyimide resin, polyamide resin, siloxane resin, acrylic resin, epoxy resin, or the like. For example, the polyimide resin may be a random copolymer or a block copolymer.

Each of the first barrier layer 112 and the second barrier layer 114 may include an inorganic material such as a silicon compound, a metal oxide, or the like. For example, each of the first barrier layer 112 and the second barrier layer 114 may include silicon oxide ($SiO_x$), silicon nitride ($SiN_x$), silicon oxynitride ($SiO_xN_y$), silicon oxycarbide ($SiO_xC_y$), silicon carbonitride. ($SiC_xN_y$), aluminum oxide ($AlO_x$), aluminum nitride ($AlN_x$), tantalum oxide ($TaO_x$), hafnium oxide ($HfO_x$), zirconium oxide ($ZrO_x$), titanium oxide ($TiO_x$), or the like.

Since the base substrate 110 includes the first organic layer 111 and the second organic layer 113, the base substrate 110 may have a flexible characteristic. Further, the first barrier layer 112 and the second barrier layer 114 may block moisture penetrating through the first organic layer 111 and the second organic layer 113.

The buffer layer 120 may be disposed on the base substrate 110. The buffer layer 120 may planarize over the base substrate 110, and may block impurities from flowing into the active layer 130 from the base substrate 110 in the process of heat-treating the active layer 130.

The buffer layer 120 may include a plurality of layers. In an embodiment, the buffer layer 120 may include a first buffer layer 121 and a second buffer layer 122. The second buffer layer 122 may be disposed on the first buffer layer 121. The first buffer layer 121 may include silicon oxide ($SiO_x$). The second buffer layer 122 may include silicon nitride ($SiN_x$).

The active layer 130 may be disposed on the buffer layer 120 in the first area 1A. In an embodiment, the active layer 130 may include polycrystalline silicon. However, the present invention is not limited thereto. In another embodiment, the active layer 130 may include amorphous silicon, an oxide semiconductor, or the like.

The first gate insulation layer 140 may be disposed on the active layer 130. The first gate insulation layer 140 may cover the active layer 130, and may be disposed on the buffer layer 120. The first gate insulation layer 140 may include an inorganic material such as a silicon compound, a metal oxide, or the like. For example, the first gate insulation layer 140 may include silicon oxide ($SiO_x$), silicon nitride ($SiN_x$), silicon oxynitride ($SiO_xN_y$), silicon oxycarbide ($SiO_xC_y$), silicon carbonitride ($SiC_xN_y$), aluminum oxide ($AlO_x$), aluminum nitride ($AlN_x$), tantalum oxide ($TaO_x$), hafnium oxide ($HfO_x$), zirconium oxide ($ZrO_x$), titanium oxide ($TiO_x$), or the like.

The first conductive layer 150 may be disposed on the first gate insulation layer 140 in the first area 1A. The first conductive layer 150 may include a first gate line 151, a second gate line 152, an emission control line 153, and a first storage electrode 154.

The first gate line 151 may extend in a first direction D1. The first gate line 151 may transmit the first gate signal GW in FIG. 2. The active layer 130 and the first gate line 151 may form the second transistor T2 and the third transistor T3.

The second gate line 152 may extend parallel to the first gate line 151 (i.e., extend in the first direction D1). The second gate line 152 may transmit the second gate signal GI (See FIG. 2). The active layer 130 and the second gate line 152 may form the fourth transistor T4 and the seventh transistor T7.

The emission control line 153 may extend parallel to the first gate line 151 (i.e., extend in the first direction D1). The emission control line 153 may transmit the emission control signal EM in FIG. 2. The active layer 130 and the emission control line 153 may form the fifth transistor T5 and the sixth transistor T6.

The first storage electrode 154 may be disposed between the first gate line 151 and the emission control line 153 in a plan view. Here, the plan view is a view shown in the third direction D3. The active layer 130 and the first storage electrode 154 may form the first transistor T1.

The first conductive layer 150 may be a single-layer including an aluminum alloy. In the case that the first conductive layer 150 includes pure aluminum, a hillock may occur on a surface of the first conductive layer 150 by a high-temperature process performed in a manufacturing process of the display device 100, and accordingly, an electrical resistance of the first conductive layer 150 may increase. When the first conductive layer 150 is formed as a multilayer including a layer containing pure aluminum and a capping layer containing titanium, titanium nitride, or molybdenum, although the occurrence of the hillock on the surface of the first conductive layer 150 may be prevented, however, a side roughness of the first conductive layer 150 may increase due to the increase of a thickness of the first conductive layer 150.

In embodiments, the aluminum alloy of the first conductive layer 150 may include at least one of nickel (Ni), lanthanum (La), neodymium (Nd), and germanium (Ge). In an embodiment, the content of materials other than aluminum (Al) in the aluminum alloy may be less than or substantially equal to about 2.0 atomic percentages (at %). 2% or less of the atoms in the aluminum alloy are the materials other than aluminum (Al) and 98% or more of the atoms in the aluminum alloy are aluminum (Al).

As the content of the materials other than aluminum (Al) in the aluminum alloy of the first conductive layer 150 increases, the occurrence of the hillock on the surface of the first conductive layer 150 may decrease, however, an electrical resistance of the first conductive layer 150 may increase. Accordingly, in this embodiment according to the invention, the content of the materials other than aluminum (Al) in the aluminum alloy of the first conductive layer 150 may adjusted be less than or substantially equal to about 2.0 at %, so that the increase of the electrical resistance of the first conductive layer 150 may be prevented.

In embodiments, the aluminum alloy of the first conductive layer 150 may include nickel (Ni) and lanthanum (La). In an embodiment, the sum of the content of nickel (Ni) and the content of lanthanum (La) may be about 0.02 at % to about 0.15 at %. The sum of the content of nickel (Ni) and the content of lanthanum (La) in the aluminum alloy of the first conductive layer 150 may be less than or substantially equal to about 0.15 at %, so that the increase of the electrical resistance of the first conductive layer 150 may be prevented.

In an embodiment, the content of nickel (Ni) may be about 0.01 at % to about 0.05 at %, and the content of lanthanum (La) may be about 0.01 at % to about 0.1 at %. When the content of nickel (Ni) is less than about 0.01 at % or the content of lanthanum (La) is less than about 0.01 at %, a hillock may occur on the surface of the first conductive layer 150. Further, when the content of nickel (Ni) is greater than about 0.05 at % or the content of lanthanum (La) is greater than about 0.1 at %, the electrical resistance of the first conductive layer 150 may excessively increase.

Figure 5:
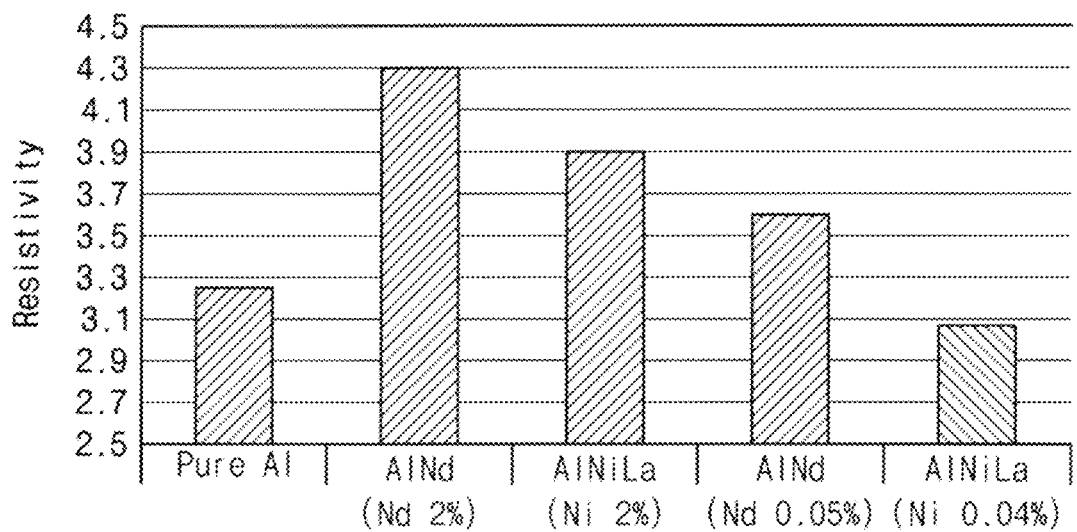
FIG. 5 is a graph illustrating a resistivity of a first conductive layer according to materials thereof.

FIG. 5 is a graph illustrating a resistivity of the first conductive layer 150 according to materials thereof.

Referring to FIG. 5, compared with pure aluminum, a resistivity of the aluminum alloy may be generally greater than that of the pure aluminum. However, by adjusting the content of materials other than aluminum (Al) in the aluminum alloy, the excessive increase of the resistivity of the aluminum alloy may be prevented. For example, as illustrated in FIG. 5, when the aluminum alloy contains nickel (Ni) and lanthanum (La) and the content of nickel (Ni) is about 0.04 at %, the resistivity of the aluminum alloy may be less than the resistivity of the pure aluminum. Accordingly, the excessive increase of the electrical resistance of the first conductive layer 150 may be prevented by this aluminum alloy.

Referring to FIGS. 3 and 4 again, as the content of materials other than aluminum (e.g., nickel (Ni)) in the aluminum alloy of the first conductive layer 150 increases, an etch rate of the first conductive layer 150 with respect to a developer (e.g., tetramethylammonium hydroxide ("TMAH")) used in the process of forming the first conductive layer 150 with a photolithography process may increase. Accordingly, the increase of the etch rate of the first conductive layer 150 with respect to the developer may be effectively prevented by adjusting the content of materials other than aluminum (e.g., nickel (Ni)) in the aluminum alloy of the first conductive layer 150.

Figure 6:
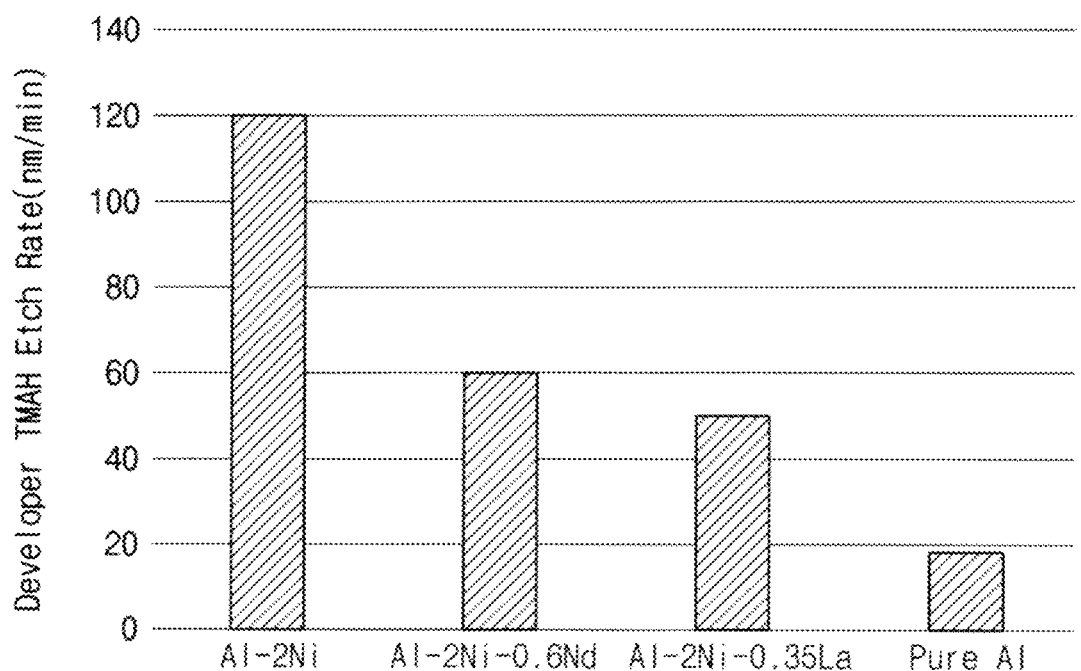
FIG. 6 is a graph illustrating an etch rate of a first conductive layer according to materials thereof.

FIG. 6 is a graph illustrating an etch rate of the first conductive layer 150 according to materials thereof.

Referring to FIG. 6, compared with pure aluminum, an etch rate (nanometers per minute (nm/min)) of the aluminum alloy with respect to the developer may be generally greater than that of the pure aluminum with respect to the developer. However, by adjusting the content of materials other than aluminum (Al) in the aluminum alloy, the excessive increase of the etch rate of the aluminum alloy may be prevented. For example, as illustrated in FIG. 6, by adjusting the content of nickel (Ni) in the aluminum alloy, the etch rate of the aluminum alloy with respect to the developer may decrease close to that of the pure aluminum with respect to the developer. Accordingly, the excessive increase of the etch rate of the first conductive layer 150 with respect to the developer may be effectively prevented.

Referring to FIGS. 3 and 4 again, the second gate insulation layer 160 may be disposed on the first conductive layer 150. The second gate insulation layer 160 may cover the first conductive layer 150, and may be disposed on the first gate insulation layer 140. The second gate insulation layer 160 may include an inorganic material such as a silicon compound, a metal oxide, or the like. For example, the second gate insulation layer 160 may include silicon oxide ($SiO_x$), silicon nitride ($SiN_x$), silicon oxynitride ($SiO_xN_y$), silicon oxycarbide ($SiO_xC_y$), silicon carbonitride. ($SiC_xN_y$), aluminum oxide ($AlO_x$), aluminum nitride ($AlN_x$), tantalum oxide ($TaO_x$), hafnium oxide ($HfO_x$), zirconium oxide ($ZrO_x$), titanium oxide ($TiO_x$), or the like.

The second conductive layer 170 may be disposed on the second gate insulation layer 160 in the first area 1A. The second conductive layer 170 may include a second storage electrode 171, an initialization voltage line 172, and a shielding electrode 173.

The second storage electrode 171 may extend in the first direction D1. The second storage electrode 171 may overlap the first storage electrode 154 in a plan view. The first storage electrode 154 and the second storage electrode 171 may form the storage capacitor CST.

The initialization voltage line 172 may extend parallel to the second storage electrode 171 (i.e., extend in the first direction D1). The initialization voltage line 172 may transmit the initialization voltage VINT (See FIG. 2).

The shielding electrode 173 may be disposed between the second storage electrode 171 and the initialization voltage line 172 in a plan view (e.g., FIG. 3). The shielding electrode 173 may overlap a portion of the active layer 130 forming the third transistor T3.

The second conductive layer 170 may be a single-layer including an aluminum alloy.

In embodiments, the aluminum alloy of the second conductive layer 170 may include at least one of nickel (Ni), lanthanum (La), neodymium (Nd), and germanium (Ge). In an embodiment, the content of materials other than aluminum (Al) in the aluminum alloy may be less than or substantially equal to about 2.0 at %.

In embodiments, the aluminum alloy of the second conductive layer 170 may include nickel (Ni) and lanthanum (La). In an embodiment, the sum of the content of nickel (Ni) and the content of lanthanum (La) may be about 0.02 at % to about 0.15 at %.

In an embodiment, the content of nickel (Ni) may be about 0.01 at % to about 0.05 at %, and the content of lanthanum (La) may be about 0.01 at % to about 0.1 at %.

The descriptions on the resistivity and the etch rate of the first conductive layer 150 according to materials thereof described with reference to FIGS. 5 and 6 may be applied to the second conductive layer 170.

The insulation interlayer 180 may be disposed on the second conductive layer 170. The insulation interlayer 180 may cover the second conductive layer 170, and may be disposed on the second gate insulation layer 160. The insulation interlayer 180 may include an inorganic material such as a silicon compound, a metal oxide, or the like. For example, the insulation interlayer 180 may include silicon oxide ($SiO_x$), silicon nitride ($SiN_x$), silicon oxynitride ($SiO_xN_y$), silicon oxycarbide ($SiO_xC_y$), silicon carbonitride. ($SiC_xN_y$), aluminum oxide ($AlO_x$), aluminum nitride ($AlN_x$), tantalum oxide ($TaO_x$), hafnium oxide ($HfO_x$), zirconium oxide ($ZrO_x$), titanium oxide ($TiO_x$), or the like.

An active contact hole ACH may be defined in the insulation interlayer 180, the second gate insulation layer 160, and the first gate insulation layer 140 in the first area 1A. The active contact hole ACH may pass through the insulation interlayer 180, the second gate insulation layer 160, and the first gate insulation layer 140, and may expose the active layer 130.

A first gate contact hole GCH1 may be defined in the insulation interlayer 180 and the second gate insulation layer 160 in the first area 1A. The first gate contact hole GCH1 may pass through the insulation interlayer 180 and the second gate insulation layer 160, and may expose the first conductive layer 150.

A second gate contact hole GCH2 may be defined in the insulation interlayer 180 in the first area A1. The second gate contact hole GCH2 may pass through the insulation interlayer 180, and may expose the second conductive layer 170.

A first opening OP1 may be defined in the insulation interlayer 180, the second gate insulation layer 160, the first gate insulation layer 140, and a first portion of the buffer layer 120. The first opening OP1 may overlap the bendable area BA.

In an embodiment, the active contact hole ACH and the first opening OP1 may be substantially simultaneously formed. The formation of the active contact hole ACH and the first opening OP1 will be described with reference to FIGS. 8 to 14 below.

In an embodiment, the first portion of the buffer layer 120 which defines the first opening OP1 therein may be the second buffer layer 122. In other words, the first opening OP1 may be defined in the insulation interlayer 180, the second gate insulation layer 160, the first gate insulation layer 140, and the second buffer layer 122.

A second opening OP2 may be defined in a second portion of the buffer layer 120 and a portion of the base substrate 110. The second opening OP2 may overlap the bendable area BA. The second portion of the buffer layer 120 which defines the second opening OP2 therein may be a portion of the buffer layer 120 other than the first portion of the buffer layer 120.

In an embodiment, the first gate contact hole GCH1, the second gate contact hole GCH2, and the second opening OP2 may be substantially simultaneously formed. The formation of the first gate contact hole GCH1, the second gate contact hole GCH2, and the second opening OP2 will be described with reference to FIGS. 8 to 14 below.

In an embodiment, the second portion of the buffer layer 120 which defines the second opening OP2 therein may be the first buffer layer 121, and the portion of the base substrate 110 which defines the second opening OP2 therein may be the second barrier layer 114. In other words, the second opening OP2 may be defined in the first buffer layer 121 and the second barrier layer 114.

In an embodiment, a width of the first opening OP1 may be greater than a width of the second opening OP2. Here, the width is measured in a plane defined by the first direction D1 and the second direction D2, and this plane is perpendicular to a third direction D3. In such an embodiment, a lateral part of the second portion of the buffer layer 120 and the portion of the base substrate 110 exposed by the second opening OP2 may protrude from a lateral part of the insulation interlayer 180, the second gate insulation layer 160, the first gate insulation layer 140, and the first portion of the buffer layer 120 exposed by the first opening OP1. For example, a lateral part of the first buffer layer 121 may protrude from a lateral part of the second buffer layer 122. Further, the first opening OP1 may expose an upper surface of the second portion of the buffer layer 120. For example, the first opening OP1 may expose an upper surface of the first buffer layer 121.

The stress relaxation layer 190 may be disposed on the insulation interlayer 180 in the bendable area BA. The stress relaxation layer 190 may fill the first opening OP1 and the second opening OP2. The stress relaxation layer 190 may include an organic material such as a photoresist, a polyacrylic resin, a polyimide resin, a polyamide resin, a siloxane resin, an acrylic resin, an epoxy resin, or the like.

When a layered-structure is bent, a stress neutral plane may exist within the layered-structure. If the stress relaxation layer 190 does not exist, excessive tensile stress or the like may be applied to wirings in the bendable area BA when the display device 100 is bent, because the positions of the wirings may not correspond to the stress neutral plane. However, by disposing the stress relaxation layer 190 in the bendable area BA and adjusting the thickness and modulus of the stress relaxation layer 190, the position of the stress neutral plane in the layered-structure included in the display device 100 may be adjusted. Accordingly, the stress-neutral plane may be positioned in the vicinity of the wirings due to the stress relaxation layer 190, thereby minimizing tensile stress applied to the wirings.

The third conductive layer 200 may be disposed on the insulation interlayer 180 in the first area 1A. The third conductive layer 200 may include a data line 201, a power voltage line 202, a first connection electrode 203, and a second connection electrode 204.

The data line 201 may extend in a direction (e.g., the second direction D2) crossing the first gate line 151. The data line 201 may transmit the data voltage DATA in FIG. 2. The data line 201 may be connected to the active layer 130 through the active contact hole ACH.

The power voltage line 202 may extend parallel to the data line 201 (e.g., extend in the second direction D2). The power voltage line 202 may transmit the first power voltage ELVDD (See FIG. 2). The power voltage line 202 may be connected to the second storage electrode 171 and the shielding electrode 173 through the second gate contact holes GCH2. Further, the power voltage line 202 may be connected to the active layer 130 through the active contact hole ACH.

The first connection electrode 203 may be connected to the second storage electrode 171 through the first gate contact hole GCH1, and may be connected to the active layer 130 through the active contact hole ACH. The second connection electrode 204 may be connected to the initialization voltage line 172 through the second gate contact hole GCH2, and may be connected to the active layer 130 through the active contact hole ACH.

The third conductive layer 200 may include a metal such as aluminum (Al), titanium (Ti), copper (Cu), molybdenum (Mo), or an alloy of the metal. The third conductive layer 200 may have a single-layer structure or a multilayer structure. In an embodiment, the third conductive layer 200 may have a multilayer structure including titanium (Ti), aluminum (Al), and titanium (Ti) that are sequentially stacked.

The third conductive layer 200 may be connected to the active layer 130 through the active contact hole ACH.

The third conductive layer 200 may directly contact the first conductive layer 150 through the first gate contact hole GCH1. In this case, the third conductive layer 200 may directly contact the first conductive layer 150 formed as the single-layer including the aluminum alloy.

The third conductive layer 200 may directly contact the second conductive layer 170 through the second gate contact hole GCH2. In this case, the third conductive layer 200 may directly contact the second conductive layer 170 formed as the single-layer including the aluminum alloy.

Figure 7:
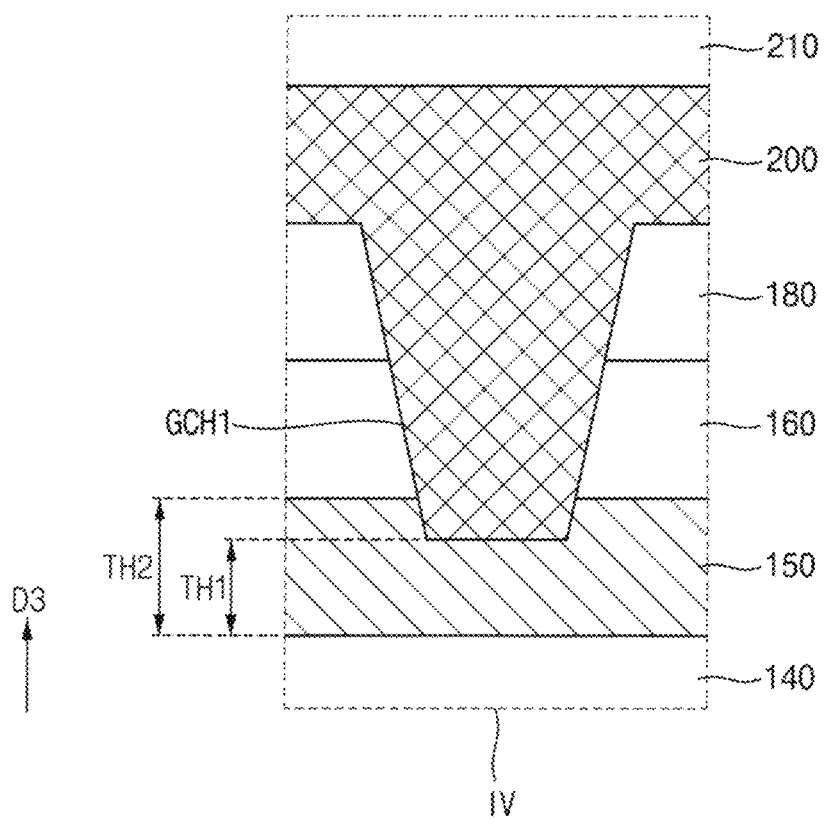
FIG. 7 is a cross-sectional view illustrating an area IV in FIG. 4 in detail.

FIG. 7 is a cross-sectional view illustrating an area IV in FIG. 4 in detail.

Referring to FIGS. 4 and 7, in an embodiment, a thickness TH1 of a first portion of the first conductive layer 150 that directly contacts the third conductive layer 200 may be less than a thickness TH2 of a second portion of the first conductive layer 150 that does not directly contact the third conductive layer 200 in a thickness direction (i.e., the third direction D3). As described above, since the first gate contact hole GCH1 and the second opening OP2 are substantially simultaneously formed, the first gate contact hole GCH1 may pass through the insulation interlayer 180 and the second gate insulation layer 160, and may form a groove in an upper surface of the first conductive layer 150.

Although only a structural relation of the first conductive layer 150 and the third conductive layer 200 is illustrated in FIG. 7, the cross-sectional structural relation between the first conductive layer 150 and the third conductive layer 200 described with reference to FIG. 7 may be also applied to a structural relation of the second conductive layer 170 and the third conductive layer 200 near the second gate contact hole GCH2 shown in FIG. 4. Accordingly, in an embodiment, a thickness of a first portion of the second conductive layer 170 that directly contacts the third conductive layer 200 may be less than a thickness of a second portion of the second conductive layer 170 that does not directly contact the third conductive layer 200. As described above, since the second gate contact hole GCH2 and the second opening OP2 are substantially simultaneously formed, the second gate contact hole GCH2 may pass through the insulation interlayer 180, and may define a groove in an upper surface of the second conductive layer 170.

Referring to FIGS. 3 and 4 again, the planarization layer 210 may be disposed on the stress relaxation layer 190 and the third conductive layer 200. The planarization layer 210 may cover the stress relaxation layer 190 and the third conductive layer 200, and may be formed on the insulation interlayer 180. The planarization layer 210 may include an organic material such as a photoresist, a polyacrylic resin, a polyimide resin, a polyamide resin, a siloxane resin, an acrylic resin, an epoxy resin, or the like.

The first electrode 220 may be disposed on the planarization layer 210 in the first area 1A. The first electrode 220 may include a metal, an alloy, a metal nitride, a conductive metal oxide, a transparent conductive material, or the like. These may be used alone or in a combination thereof. For example, the first electrode 220 may include silver (Ag), indium tin oxide ("ITO"), or the like.

The pixel defining layer 230 may be disposed on the first electrode 220 in the first area 1A. The pixel defining layer 230 may partially cover the first electrode 220, and may be formed on the planarization layer 210. In an embodiment, the pixel defining layer 230 may have an opening exposing a central portion of the first electrode 220, and the pixel defining layer 230 may cover a peripheral portion of the first electrode 220. The pixel defining layer 230 may include an organic material such as a photoresist, a polyacrylic resin, a polyimide resin, a polyamide resin, a siloxane resin, an acrylic resin, an epoxy resin, or the like.

The emission layer 240 may be disposed on the first electrode 220 in the opening of the pixel defining layer 230. The emission layer 240 may include at least one of an organic light emitting material and a quantum dot.

In an embodiment, the organic light emitting material may include a low molecular weight organic compound or a high molecular weight organic compound. For example, the low molecular weight organic compound may include copper phthalocyanine, N,N'-diphenylbenzidine, tris-(8-hydroxyquinoline)aluminum, or the like, and the high molecular organic compound may include poly(3,4-ethylenedioxythiophene), polyaniline, polyphenylenevinylene, polyfluorene, or the like.

In an embodiment, the quantum dot may include a core including a group II-VI compound, a group III-V compound, a group IV-VI compound, a group IV element, a group IV compound, and combinations thereof. In an embodiment, the quantum dot may have a core-shell structure including a core and a shell surrounding the core. The shell may serve as a protective layer for maintaining semiconductor properties by preventing chemical modification of the core, and as a charging layer for imparting electrophoretic properties to the quantum dot.

The second electrode 250 may be disposed on the pixel defining layer 230 and the emission layer 240. The second electrode 250 may include a metal, an alloy, a metal nitride, a conductive metal oxide, a transparent conductive material, or the like. These may be used alone or in a combination thereof. For example, the second electrode 250 may include aluminum (Al), platinum (Pt), silver (Ag), magnesium (Mg), gold (Au), chromium (Cr), tungsten (W), titanium (Ti), or the like. The first electrode 220, the emission layer 240, and the second electrode 250 may form the light emitting element EL.

Hereinafter, a method of manufacturing a display device according to an embodiment will be described with reference to FIGS. 8 to 14.

FIGS. 8, 9, 10, 11, 12, 13, and 14 are cross-sectional views illustrating a method of manufacturing a display device according to an embodiment. For example, FIGS. 8 to 14 may illustrate a method of manufacturing the display device 100 described with reference to FIGS. 1 to 7.

Figure 8:
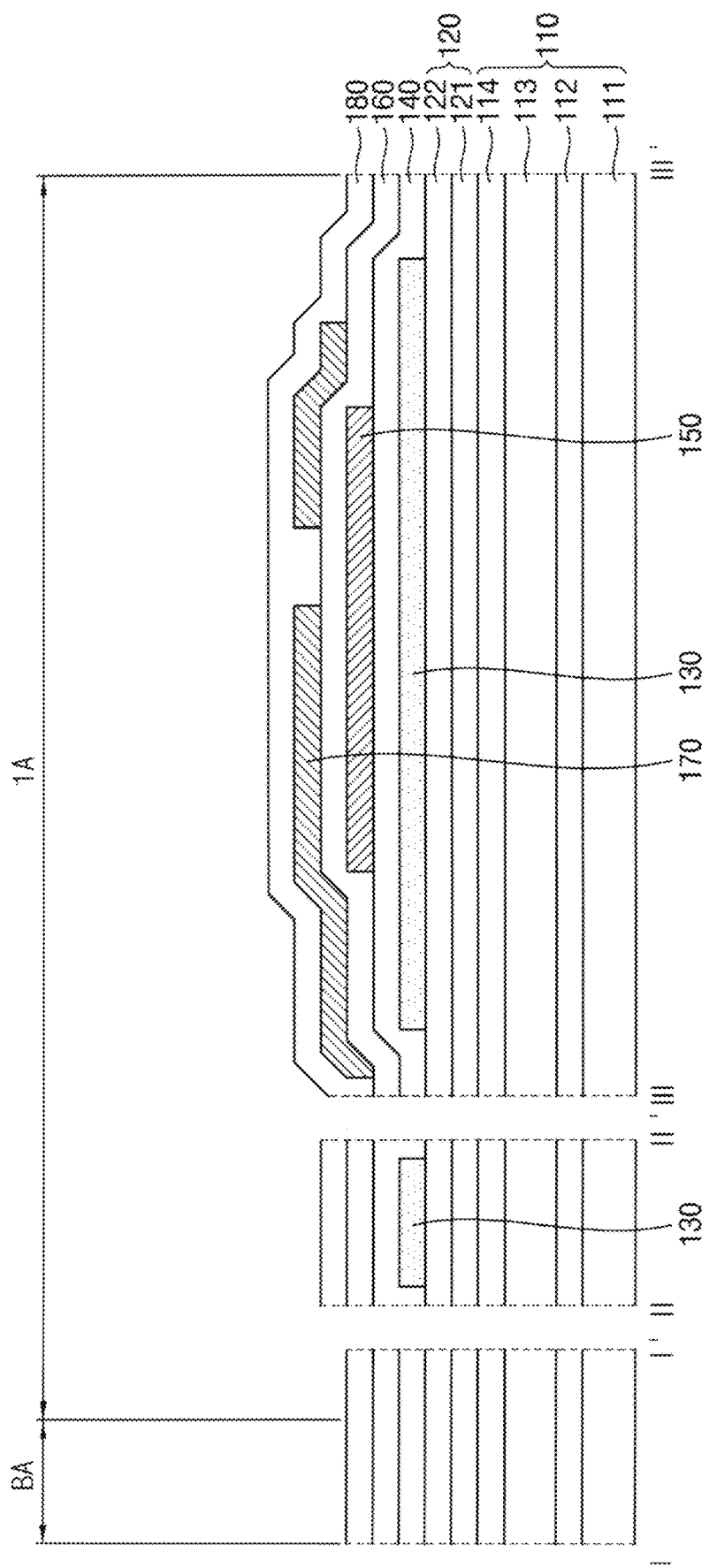
FIGS. 8, 9, 10, 11, 12, 13, and 14 are cross-sectional views illustrating a method of manufacturing a display device according to an embodiment.

Referring to FIG. 8, the buffer layer 120, the active layer 130, the first gate insulation layer 140, the first conductive layer 150, the second gate insulation layer 160, the second conductive layer 170, and the insulation interlayer 180 may be sequentially formed on the base substrate 110.

First, the buffer layer 120 may be formed on the base substrate 110. In an embodiment, the base substrate 110 may includes the first organic layer 111, the first barrier layer 112 formed on the first organic layer 111, the second organic layer 113 formed on the first barrier layer 112, and the second barrier layer 114 formed on the second organic layer 113. In an embodiment, the buffer layer 120 may include the first buffer layer 121 and the second buffer layer 122 formed on the first buffer layer 121.

Then, the active layer 130 may be formed on the buffer layer 120, and the first gate insulation layer 140 may be formed on the active layer 130. The active layer 130 may be formed in the first area 1A.

Then, the first conductive layer 150 may be formed on the first gate insulation layer 140, the second gate insulation layer 160 may be formed on the first conductive layer 150, and the second conductive layer 170 may be formed on the second gate insulation layer 160. The first conductive layer 150 and the second conductive layer 170 may be formed in the first area 1A. Each of the first conductive layer 150 and the second conductive layer 170 may be formed as a single-layer including an aluminum alloy. In an embodiment, the aluminum alloy of each of the first conductive layer 150 and the second conductive layer 170 may include at least one of nickel (Ni), lanthanum (La), neodymium (Nd), and germanium (Ge).

The first conductive layer 150 and the second conductive layer 170 may be formed by a photolithography process including coating, exposure, development, or the like. When the content of materials other than aluminum (Al) (e.g., nickel (Ni)) in the aluminum alloy of each of the first conductive layer 150 and the second conductive layer 170 increases, the etch rate of each of the first conductive layer 150 and the second conductive layer 170 with respect to a developer (e.g., TMAH) used in the process of forming the first conductive layer 150 and the second conductive layer 170 with the photolithography process may increase. Accordingly, by adjusting the content of materials other than aluminum (Al) (e.g., nickel (Ni)) in the aluminum alloy of each of the first conductive layer 150 and the second conductive layer 170, the increase of the etch rate of each of the conductive layer 150 and the second conductive layer 170 with respect to the developer may be prevented.

Then, the insulation interlayer 180 may be formed on the second conductive layer 170.

Figure 9:
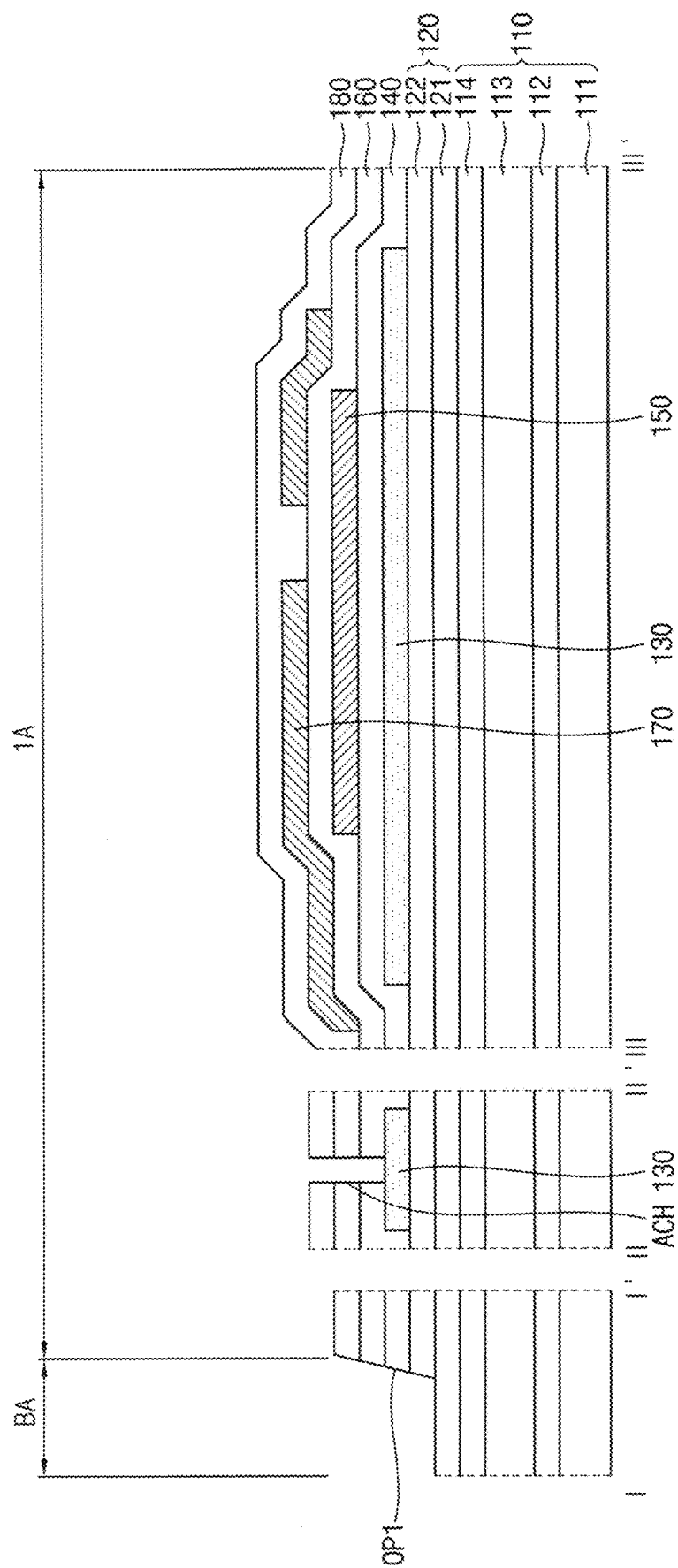

Referring to FIG. 9, the active contact hole ACH exposing the active layer 130 may be formed in the insulation interlayer 180, the second gate insulation layer 160, and the first gate insulation layer 140, and the first opening OP1 overlapping the bendable area BA may be formed in the insulation interlayer 180, the second gate insulation layer 160, the first gate insulation layer 140, and a first portion of the buffer layer 120. The active contact hole ACH and the first opening OP1 may be substantially simultaneously formed.

In an embodiment, the first portion of the buffer layer 120 may be the second buffer layer 122. In other words, the first opening OP1 may be formed in the insulation interlayer 180, the second gate insulation layer 160, the first gate insulation layer 140, and the second buffer layer 122.

Figure 10:
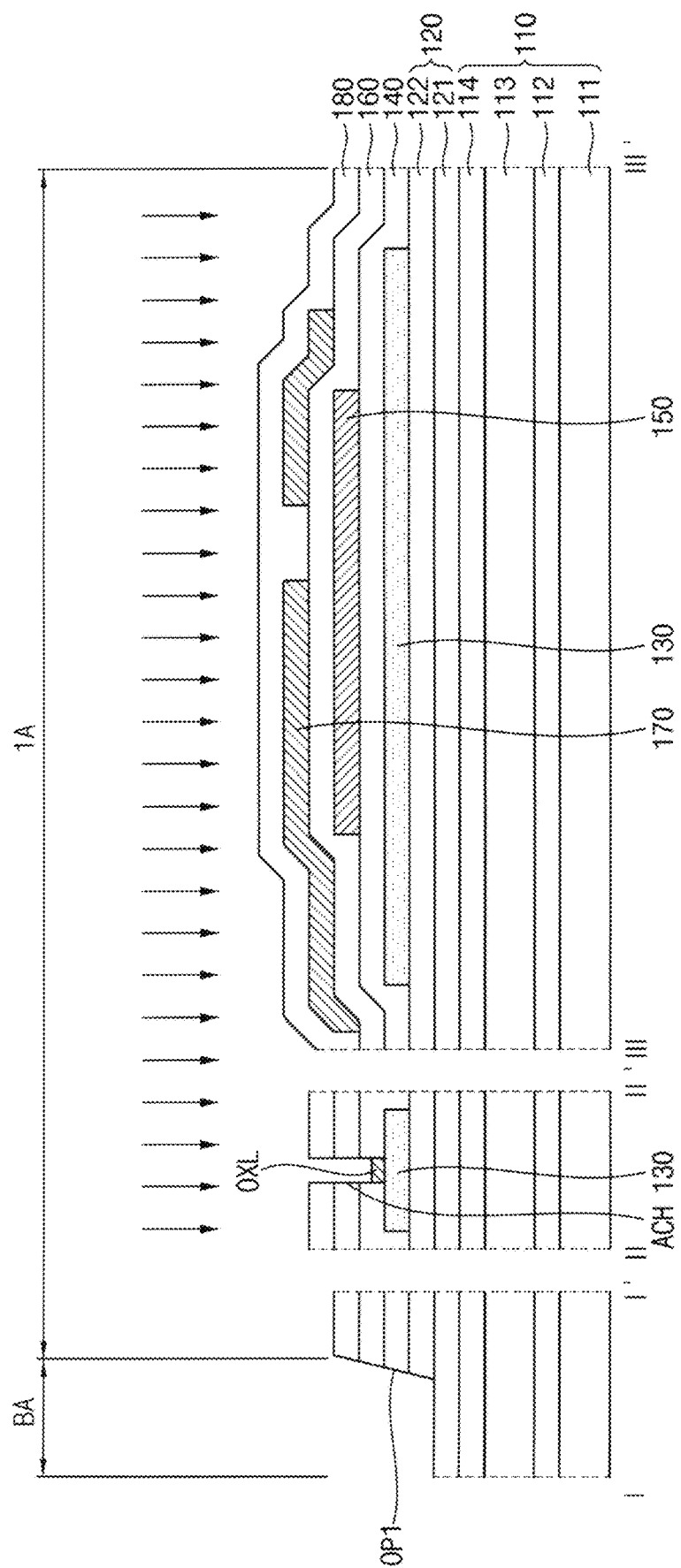

Referring to FIG. 10, after substantially simultaneously forming the active contact hole ACH and the first opening OP1, the active layer 130 may be heat-treated. When the active layer 130 is heat-treated, electrical characteristics of transistors formed by the active layer 130, the first conductive layer 150, and the second conductive layer 170 may be improved. In an embodiment, by heat-treating the active layer 130, a driving range of the first transistor T1 in FIG. 3 may be widened, and a deviation of a threshold voltage of the second transistor T2 in FIG. 3 may decrease.

If each of the first conductive layer 150 and the second conductive layer 170 includes pure aluminum, a hillock may occur on a surface of each of the first conductive layer 150 and the second conductive layer 170 due to a high temperature in the process of heat-treating the active layer 130. However, in the embodiments, each of the first conductive layer 150 and the second conductive layer 170 may include the aluminum alloy, so that the hillock may not occur on the surface of each of the first conductive layer 150 and the second conductive layer 170 in the process of heat-treating the active layer 130.

An oxide layer OXL may be formed on the active layer 130 in the process of heat-treating the active layer 130. For example, in the process of heat-treating the active layer 130, oxygen ions may react with an upper surface of the active layer 130 exposed by the active contact hole ACH to form the oxide layer OXL.

Figure 11:
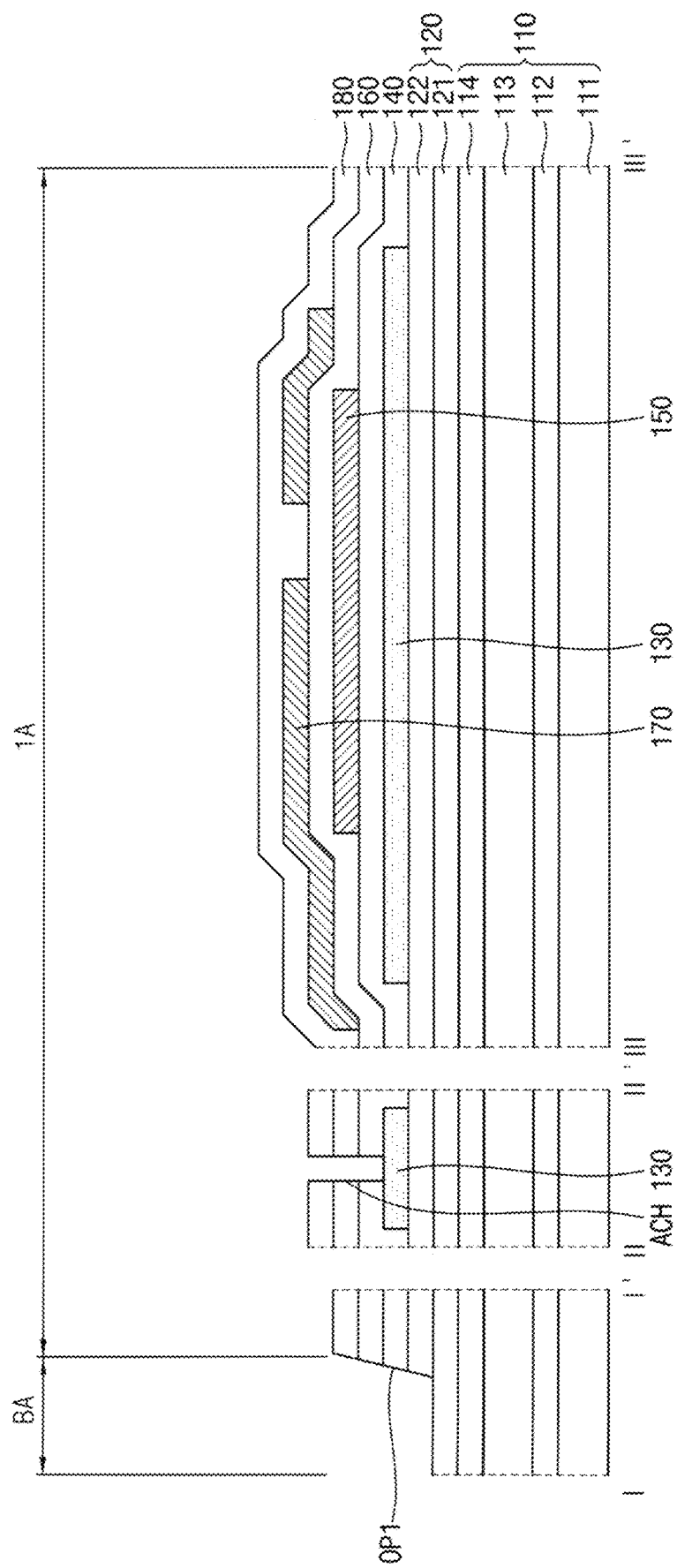

Referring to FIG. 11, the oxide layer OXL formed on the active layer 130 by the heat-treatment may be removed. In an embodiment, the oxide layer OXL may be removed with a buffered oxide etchant (BOE) or hydrogen fluoride (HF).

Figure 12:
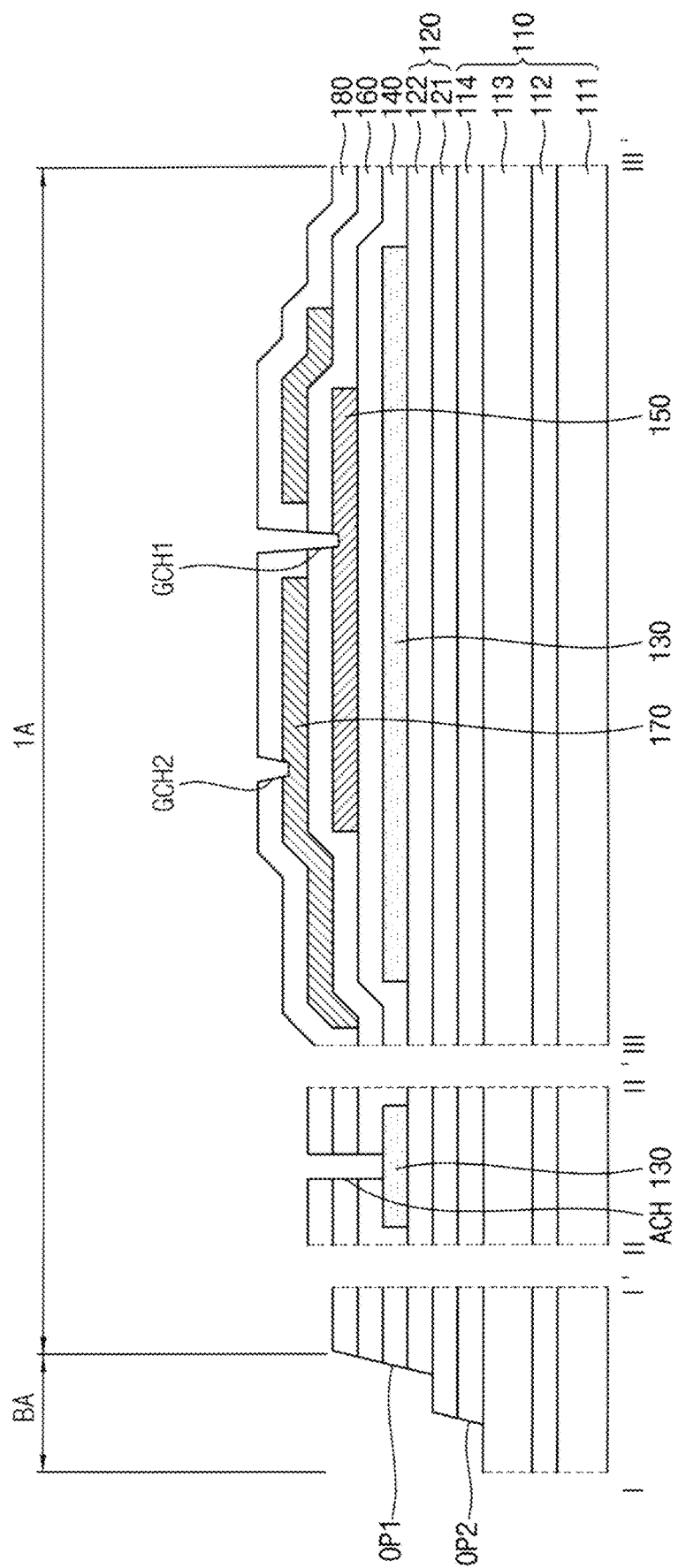

Referring to FIG. 12, the first gate contact hole GCH1 exposing the first conductive layer 150 may be formed in the insulation interlayer 180 and the second gate insulation layer 160, the second gate contact hole GCH2 exposing the second conductive layer 170 may be formed in the insulation interlayer 180, and the second opening OP2 overlapping the bendable area BA may be formed in a second portion of the buffer layer 120 and a portion of the base substrate 110. The first gate contact hole GCH1, the second gate contact hole GCH2, and the second opening OP2 may be substantially simultaneously formed.

In an embodiment, the second portion of the buffer layer 120 may be the first buffer layer 121, and the portion of the base substrate 110 may be the second barrier layer 114. In other words, the second opening OP2 may be defined in the first buffer layer 121 and the second barrier layer 114.

In the prior art, after substantially simultaneously forming the active contact hole ACH, the first gate contact hole GCH1, the second gate contact hole GCH2, and the first opening OP1, the oxide layer OXL formed in the active contact hole ACH may be removed with BOE or HF. In the prior art, the first conductive layer 150 and the second conductive layer 170 exposed by the first gate contact hole GCH1 and the second gate contact hole GCH2, respectively, may be damaged by BOE or HF. Accordingly, each of the first conductive layer 150 and the second conductive layer 170 may further include a capping layer for protecting pure aluminum or an aluminum alloy. However, when each of the first conductive layer 150 and the second conductive layer 170 includes the capping layer, a side roughness of each of the first conductive layer 150 and the second conductive layer 170 may increase.

In contrast, in the embodiments of the present invention, after removing the oxide layer OXL formed in the active contact hole ACH with BOE or HF, the first gate contact hole GCH1 and the second gate contact hole GCH2 may be formed, so that the first conductive layer 150 and the second conductive layer 170 exposed by the first gate contact hole GCH1 and the second gate contact hole GCH2, respectively, may not be damaged by BOE or HF. Further, since the first gate contact hole GCH1 and the second gate contact hole GCH2 are substantially simultaneously formed with the second opening OP2, an additional process for forming the second opening OP2 may not be required.

Figure 13:
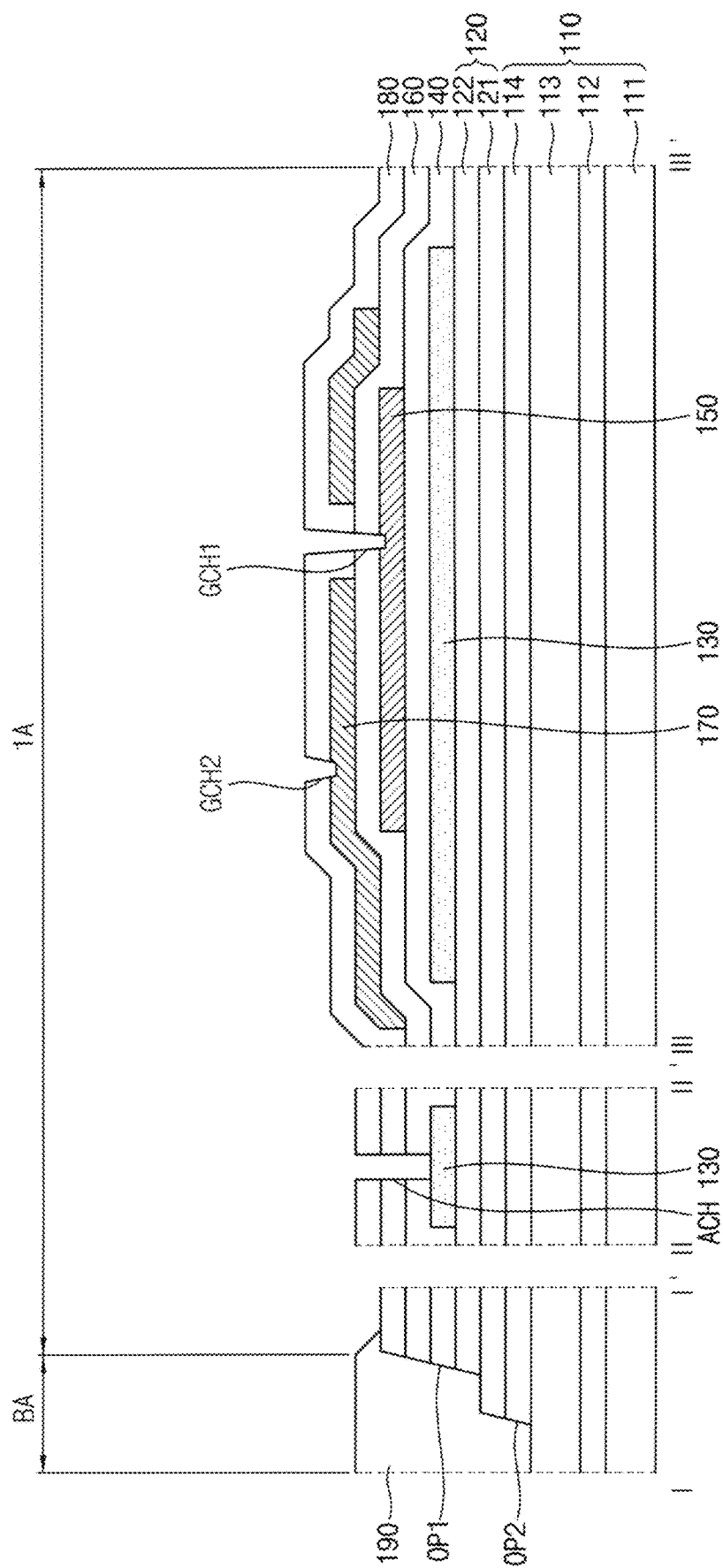

Referring to FIG. 13, the stress relaxation layer 190 may be formed on the insulation interlayer 180 in the bendable area BA. The stress relaxation layer 190 may fill the first opening OP1 and the second opening OP2.

Figure 14:
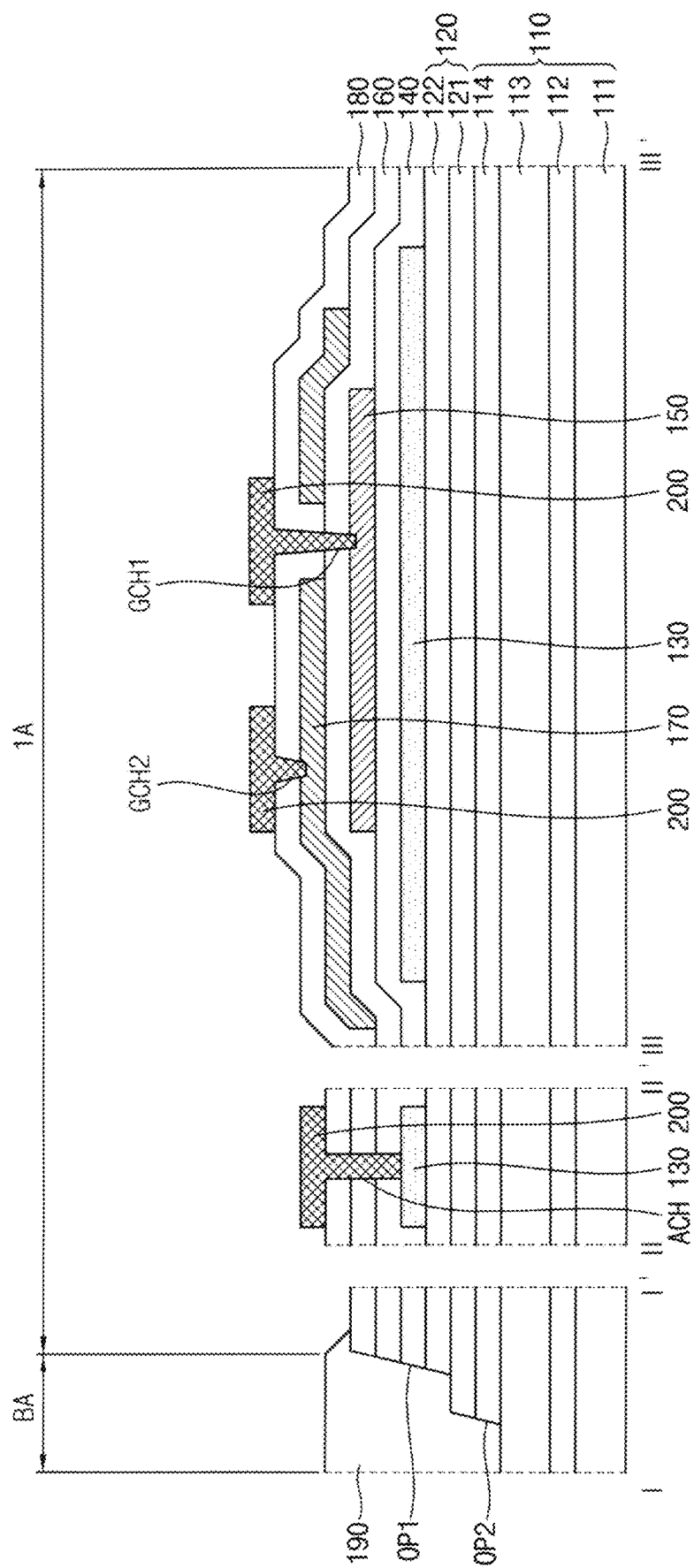

Referring to FIG. 14, the third conductive layer 200 may be formed on the insulation interlayer 180 in the first area 1A. The third conductive layer 200 may be connected to the active layer 130 through the active contact hole ACH, may directly contact the first conductive layer 150 through the first gate contact hole GCH1, and may directly contact the second conductive layer 170 through the second gate contact hole GCH2. The third conductive layer 200 may directly contact the first conductive layer 150 and the second conductive layer 170 each formed as the single-layer including the aluminum alloy.

The display device according to the embodiments may be applied to a display device included in a computer, a notebook, a mobile phone, a smartphone, a smart pad, a PMP, a PDA, an MP3 player, or the like.

Although the display devices and the methods of manufacturing the display devices according to the embodiments have been described with reference to the drawings, the illustrated embodiments are examples, and may be modified and changed by a person having ordinary knowledge in the relevant technical field without departing from the technical spirit described in the following claims.

What is claimed is:
1. A display device comprising:
a base substrate;
a buffer layer disposed on the base substrate;
an active layer disposed on the buffer layer;
a first gate insulation layer disposed on the active layer;
a first conductive layer disposed on the first gate insulation layer and which is a single-layer including an aluminum alloy;
a second gate insulation layer disposed on the first conductive layer;
a second conductive layer disposed on the second gate insulation layer and which is a single-layer including an aluminum alloy;
an insulation interlayer disposed on the second conductive layer; and
a third conductive layer disposed on the insulation interlayer, directly contacting the first conductive layer through a first gate contact hole defined in the insulation interlayer and the second gate insulation layer, and directly contacting the second conductive layer through a second gate contact hole defined in the insulation interlayer,
wherein a thickness of a first portion of the first conductive layer which directly contacts the third conductive layer is less than a thickness of a second portion of the first conductive layer which does not directly contact the third conductive layer.

2. The display device of claim 1, wherein the aluminum alloy of the first conductive layer includes at least one of nickel (Ni), lanthanum (La), neodymium (Nd), and germanium (Ge).

3. The display device of claim 2, wherein a content of materials other than aluminum in the aluminum alloy of the first conductive layer is less than or equal to about 2 atomic percentages (at %).

4. The display device of claim 1, wherein the aluminum alloy of the first conductive layer includes nickel (Ni) and lanthanum (La).

5. The display device of claim 4, wherein a sum of a content of nickel and a content of lanthanum in the aluminum alloy of the first conductive layer is about 0.02 at % to about 0.15 at %.

6. The display device of claim 4, wherein in the aluminum alloy of the first conductive layer, a content of nickel is about 0.01 at % to about 0.05 at %, and
wherein a content of lanthanum is about 0.01 at % to about 0.1 at %.

7. The display device of claim 1, wherein
a thickness of a first portion of the second conductive layer which directly contacts the third conductive layer is less than a thickness of a second portion of the second conductive layer which does not directly contact the third conductive layer.

8. The display device of claim 1, wherein the active layer includes polycrystalline silicon.

9. The display device of claim 1, wherein the first conductive layer and the second conductive layer form a storage capacitor.

10. The display device of claim 1, wherein the second conductive layer includes a shielding electrode.

11. The display device of claim 1, wherein the second conductive layer includes an initialization voltage line.

12. The display device of claim 1, wherein the third conductive layer includes a power voltage line.

13. The display device of claim 1, further comprising:
a planarization layer disposed on the third conductive layer;
a first electrode disposed on the planarization layer;
an emission layer disposed on the first electrode; and
a second electrode disposed on the emission layer.

14. A display device comprising:
a base substrate;
a buffer layer disposed on the base substrate;
an active layer disposed on the buffer layer;
a first gate insulation layer disposed on the active layer;
a first conductive layer disposed on the first gate insulation layer and which is a single-layer including an aluminum alloy;
a second gate insulation layer disposed on the first conductive layer;
a second conductive layer disposed on the second gate insulation layer and which is a single-layer including an aluminum alloy;
an insulation interlayer disposed on the second conductive layer;
a third conductive layer disposed on the insulation interlayer, directly contacting the first conductive layer through a first gate contact hole defined in the insulation interlayer and the second gate insulation layer, and directly contacting the second conductive layer through a second gate contact hole defined in the insulation interlayer; and
a bendable area,
wherein a first opening overlapping the bendable area in a plan view is defined in the insulation interlayer, the second gate insulation layer, the first gate insulation layer, and a first portion of the buffer layer, and
wherein a second opening overlapping the bendable area in the plan view is defined in a second portion of the buffer layer and a portion of the base substrate.

15. The display device of claim 14, wherein the base substrate includes:
a first organic layer;
a first barrier layer disposed on the first organic layer;
a second organic layer disposed on the first barrier layer; and
a second barrier layer disposed on the second organic layer, and
wherein the buffer layer includes:
a first buffer layer disposed on the base substrate and including silicon oxide; and
a second buffer layer disposed on the first buffer layer and including silicon nitride.

16. The display device of claim 15, wherein the first portion of the buffer layer is the second buffer layer,
wherein the second portion of the buffer layer is the first buffer layer, and
wherein the portion of the base substrate is the second barrier layer.

17. The display device of claim 14, wherein a width of the first opening is greater than a width of the second opening.

* * * * *